United States Patent [19]
Camacho et al.

[11] Patent Number: 6,167,487
[45] Date of Patent: Dec. 26, 2000

[54] MULTI-PORT RAM HAVING FUNCTIONALLY IDENTICAL PORTS

[75] Inventors: Stephen Camacho, Durham; Rhonda Cassada, Hillsborough; William L. Randolph, Durham, all of N.C.

[73] Assignee: Mitsubishi Electronics America, Inc., Cypress, Calif.

[21] Appl. No.: 09/006,190

[22] Filed: Jan. 13, 1998

Related U.S. Application Data

[60] Provisional application No. 60/040,053, Mar. 7, 1997.

[51] Int. Cl.[7] ................................................ G06F 13/00
[52] U.S. Cl. ...................... 711/131; 711/149; 365/189.04; 365/230.05
[58] Field of Search ..................... 711/149, 131; 365/189.04, 230.05

[56] References Cited

U.S. PATENT DOCUMENTS

| | | | |
|---|---|---|---|
| 5,321,652 | 6/1994 | Ito ....................................... | 365/189.07 |
| 5,557,768 | 9/1996 | Braceras et al. ......................... | 711/131 |
| 5,566,318 | 10/1996 | Joseph ................................... | 711/118 |
| 5,875,470 | 2/1999 | Dreibelbis et al. ...................... | 711/147 |

OTHER PUBLICATIONS

Hodges et al.; Analysis and Design of Digital Integrated Circuits; 1983; pp. 12–14.

Microsoft Press; Microsoft Press Computer Dictionary, 2nd ed.; 1994; pp. 57–58 and 373.

Intel; Pentium Pro Family Developer's Manual–vol. 1: Specifications; 1996, p. 3–9.

*Primary Examiner*—David L. Robertson
*Attorney, Agent, or Firm*—Burns, Doane, Swecker & Mathis, L.L.P.

[57] ABSTRACT

A memory having a SRAM, a DRAM, and two independent and functionally identical IO ports. Each port may be used as a read-only, a write-only, or a read-write port. One port may perform a read access to the SRAM, whereas the other port may carry out a write access to the SRAM in the same clock cycle. Each and every location of the SRAM may be accessed from any of the ports. Each port comprises a two-stage pipelined data path for providing a read or write access to the SRAM. Stage 1 decodes control and write enable signals, latches address signals and performs the output of read data. Stage 2 supports accesses to SRAM cells for writing and reading data. In a unified-port mode of operation, two 16-bit ports may be combined to produce a single port supporting a 32-bit write or read access to the SRAM. In a data burst mode of operation, each port may be programmed to select individual length of data bursts and individual burst type.

12 Claims, 5 Drawing Sheets

MULTI-PORT RAM HAVING FUNCTIONALLY IDENTICAL PORTS

This application claims the benefit of U.S. Provisional Application No. 60/040,053 filed Mar. 7, 1997.

TECHNICAL FIELD

This application relates to memory devices, and in particular, to a multi-port random access memory (MPRAM) that incorporates identical and independent input/output (IO) ports.

BACKGROUND ART

The development of a computer graphics system creates the need for fast memories capable of storing huge amounts of data, such as 3-D graphics data. Among such memories are cached memories developed to improve DRAM main memory performance by utilizing a faster SRAM cache memory for storing the most commonly accessed data. For example, U.S. Pat. No. 5,566,318 discloses an enhanced DRAM that integrates a SRAM cache memory with a DRAM on a single chip. Sense amplifiers and column write select registers are coupled between the SRAM cache and the DRAM memory array. A column decoder is associated with the SRAM cache for providing access to the desired column of the SRAM. A row decoder is associated with the DRAM memory array to enable access to particular rows of the DRAM. Input/output control and data latches receive data from the SRAM to provide data output via data input/output lines. The current row of data being accessed from the DRAM memory array is held in the SRAM cache memory. Should a cache "miss" be detected, the entire cache memory is refilled from the DRAM memory array over a DRAM-to-cache memory bus.

As a way of improving speed and performance of a RAM, a dual-port RAM has been developed which enables two separate input/output ports to access the memory array. However, the dual-port RAM cannot provide effective control of data input and output, because its ports are not interchangeable. For example, data traffic cannot be redistributed between the ports, when one of them is overloaded and the other is underloaded.

Accordingly, it would be desirable to provide a multi-port RAM chip having interchangeable ports.

Also, it would be desirable to provide a multi-port RAM which would be fully functional through one port if the other port is disabled.

Further, the dual-port RAM provides an external device, such as a graphics controller, with only write or read access to the memory array at one time. For example, one port cannot provide reading data from the memory array, while the other port being used for writing data to the memory array.

It would be desirable to provide a multi-port RAM that allows read and write accesses from different ports to be performed simultaneously.

Also, it would be desirable to enable a multi-port RAM to combine its two input/output ports into a single input/output port twice as wide as each port of the RAM.

DISCLOSURE OF THE INVENTION

Accordingly, one advantage of the invention is in providing a multi-port RAM having interchangeable input/output ports.

Another advantage of the invention is in providing a multi-port RAM that allows read and write accesses from different ports to be performed simultaneously.

A further advantage of the invention is in providing a multi-port RAM having interchangeable ports.

Another advantage of the invention is in providing a multi-port RAM which would be fully functional through one port if the other port is disabled.

A further advantage of the invention is in providing a multi-port RAM enabled to combine its two input/output ports into a single input/output port twice as wide as each port of the RAM.

The above and other advantages of the invention are achieved, at least in part, by providing a memory device arranged on a single chip and having first and second input/output pins for providing access to a cache SRAM memory and a main DRAM memory arranged on the chip. First and second data paths are respectively coupled between the first and second input/output pins, and the cache memory for providing bi-directional data transfers. The first data path is interchangeable with the second data path in providing access to the cache and main memories.

In accordance with the first aspect of the invention, the first data path may be controlled independently of the second data path.

In accordance with another aspect of the invention, the first data path may be arranged to provide data reading from the cache memory concurrently with data writing to the cache memory provided by the second data path.

In accordance with a preferred embodiment of the invention, each of the first and second data paths comprises a pipeline having a first stage and a second stage for providing read and write accesses to the cache memory. The first stage may comprise a decoding circuit for decoding write control signals and read control signals, and an amplifier coupled to the first or second input/output pin for driving data read from the cache memory. The second stage coupled between the first stage and the cache memory may comprise a control circuit responsive to address signals and the decoded write or read control signals for supplying the cache memory with a write or read address signal for selecting a location in the cache memory to be accessed. Also, the second stage may comprise an input latch for receiving data from the first or second input/output pin and writing the data into the selected location in the cache memory, and a read latch for receiving data read from the selected location in the cache memory.

In accordance with another aspect of the invention, the first and second data path may be arranged so as to provide a single port for input/output of a data combination to or from the cache memory. For example, the first data path may provide input/output of the least significant word in the data combination, whereas the second data path may provide input/output of the most significant word in the data combination.

In accordance with a further aspect of the invention, the first and second data paths may be arranged to provide input/output of data bursts to or from the cache memory independently of each other. For example, the first data path may be controlled to provide input/output of a first data burst having a first length, and the second data path may be controlled to provide input/output of a second data burst having a second length different from the first length.

These and other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
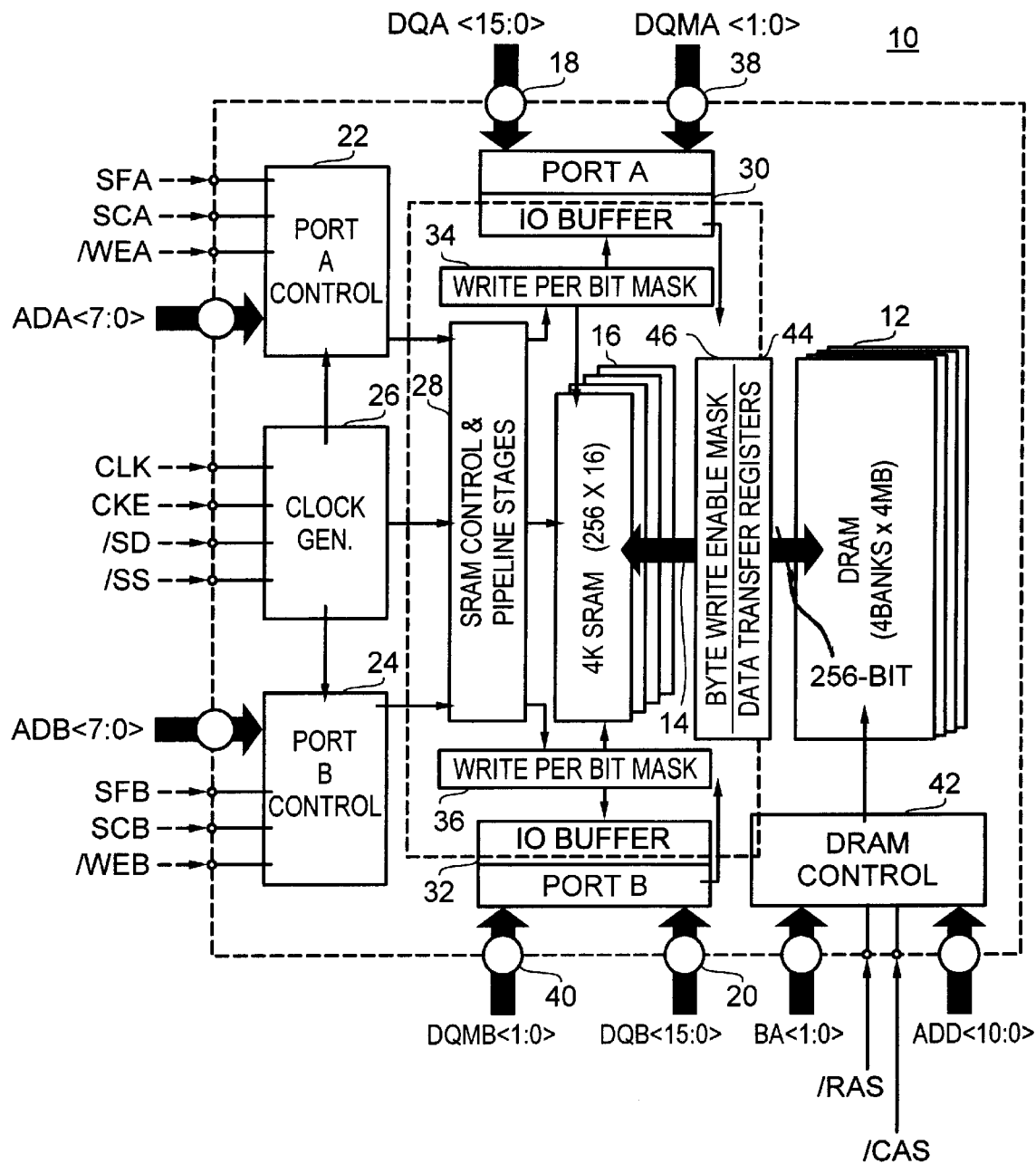
FIG. 1 is a block diagram illustrating architecture of a multi-port RAM chip of the present invention.

Although the invention has general applicability in the field of memory devices, the best mode for practicing the invention is based in part on the realization of a multi-port RAM (MPRAM) 10 illustrated in FIG. 1. The MPRAM 10 arranged on a single chip comprises a DRAM 12 divided into four independently addressable memory banks of 4 Mbits each. Each bank contains a memory array organized as 512 rows by 32 columns by 256 bits. As discussed in more detail later, a single 256-bit global input-output (IO) bus 14 is shared by all 4 banks of the DRAM 12, and connects the DRAM 12 to a SRAM 16.

The 4-kbit SRAM 16 may be organized as 16 lines by 16 words by 16 bits. Each 256-bit transfer between the DRAM 12 and the SRAM 16 replaces or updates one of 16 lines in the SRAM 16.

The MPRAM 10 has two identical and independent 16-bit IO ports A and B. Each of the ports A and B provides read and write accesses to each cell of the SRAM 16. IO data pins 18 and 20 are respectively connected to the ports A and B for providing input and output of 16-bit data DQA and DQB. An external 16-bit IO bus may be connected to each of the data pins 18 and 20 for writing and reading data to and from the MPRAM 10.

SRAM control signals SCA and SCB for the ports A and B, respectively, are supplied via a port A control circuit 22 and a port B control circuit 24 to define SRAM operations such as data read or write, and burst termination. Write enable commands /WEA and /WEB for the ports A and B are provided via the port control circuits 22 and 24, respectively, to decode SRAM write operations. Also, the port control circuits 22 and 24 may receive special function commands SFA and SFB, respectively, for enabling a write per bit mode of operation, and to provide burst termination.

A clock generator 26 supplied with a master clock signal CLK provides internal clocks for MPRAM operations. All input signals of the MPRAM are referenced to the rising edge of the master clock CLK. A master clock enable signal CKE is fed into the clock generator 26 to enable the internal clock generation. Chip select signals /SD and /SS provide chip select functions for the DRAM 12 and the SRAM 16, respectively.

The port control circuits 22 and 24, and the clock generator 26 are coupled to a SRAM control circuit 28 that controls write and read accesses to the SRAM 16. The data transfer path between each of the IO data pins 18 and 20 and the SRAM 16 for data writing or reading is arranged as a two-stage pipeline.

To write data into the SRAM 16, write commands WA and WB for ports A and B, respectively, may be issued by the SRAM control circuit 28 on the first clock cycle, and the data to be written is supplied on the second clock cycle. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16, read commands RA and RB may be issued by the SRAM control circuit 28 on the first clock cycle, the data is accessed at the second clock's rising edge, and the data is made valid on the third clock cycle. Similarly to writing operations, the addressed line and word of the SRAM 16 is determined by the address signals ADA and ADB for ports A and B, respectively. For example, the addressed line may be defined by four high-order bits of the address signals ADA and ADB, and the addressed 16-bit word may be determined by four low-order bits of the address signals ADA and ADB.

As discussed in more detail below, the ports A and B are independent and may simultaneously provide reading and writing data from or to any location in the SRAM 16. However, the user is prevented from writing to the same SRAM cell from both ports simultaneously. IO buffers 30 and 32 are coupled to the ports A and B, respectively, to buffer data during read and write operations.

Write per bit mask registers 34 and 36 connected to the IO buffers 30 and 32, respectively, are used to perform masked write operations from ports A and B. The SRAM control circuits issue masked write commands MWA and MWB for ports A and B, respectively, to mask the DQA and DQB data being read from the SRAM 16 or written into the SRAM 16. Pins 38 and 40 supply two-bit mask control data DQMA and DQMB for ports A and B, respectively. When either bit of the mask control data DQMA and DQMB is set high, the DQA and DQB data, respectively, being read or written is masked. For example, the high-order bit of the mask control data DQMA and DQMB respectively controls the upper byte of the DQA and DQB data. The low-order bit of the mask control data DQMA and DQMB may respectively control the lower byte of the DQA and DQB data. Load mask register commands LMRA and LMRB may be issued by the SRAM control circuit 28 for ports A and B, respectively, to load the write per bit registers 34 and 36.

The MPRAM 10 allows the SRAM 16 and DRAM 12 to operate concurrently. A DRAM control circuit 42 forms DRAM control commands defined by control signals /RAS and /CAS. A 2-bit bank address command BA selects one of four DRAM banks. An 11-bit address command ADD selects DRAM row and column addresses, DRAM transfer operations and lines in the SRAM 16 from which data may be transferred to the DRAM 12 or to which data may be transferred from the DRAM 12. For example, nine low-order bits of the ADD command may select DRAM row address, five low-order bits may select DRAM column address, two bits of the ADD command may be used to define DRAM transfer operations, and four high-order bits may select one of sixteen lines in the SRAM.

The DRAM control circuit 42 forms a DRAM read transfer command DRT to transfer 1 of 32 blocks of data indicated by the ADD command into 1 of 16 lines in the SRAM 16. A DRAM write transfer command DWT is formed by the DRAM control circuit 42 to transfer data from 1 of 16 SRAM lines indicated by the ADD command to 1 of 32 blocks in the DRAM 12.

Data transfer registers 44 are arranged between the DRAM 12 and SRAM 16 to support data transfer between the DRAM 12 and SRAM 16. A 32-bit byte write enable mask register 46 is used to mask DRAM write transfers. The register 46 may be loaded from either port A or port B when the load mask register command LMR is issued. Each bit in the register 46 masks a byte of the 256-bit global IO bus 14. The byte write enable mask register 46 and write per bit mask registers 34 and 36 may be bypassed during writes to the DRAM 12 and SRAM 16, respectively. Data transfers between the SRAM 16 and the DRAM 12 via the global IO bus 16 are disclosed in more detail in our copending application Ser. No. 08/937,004, entitled "MULTI-PORT RAM HAVING SHARED GLOBAL BUS" filed on Sep. 24, 1997 and incorporated herewith by reference.

The MPRAM 10 has a programmable burst mode that allows the user to select burst lengths of 1, 2, 4 and 8 for bursts of data being written from the ports A and B to the SRAM 16 or bursts of data being read from the SRAM 16 to the ports A and B. Sequential or interleave bursts may be selected. A set mode register command SMR issued by the DRAM control circuit 42 enables the burst length and type to be programmed in an internal mode register. A mode register code (MRC) to be programmed in the mode register may be entered using the ADD command. The MRC is stored in the mode register until it is overwritten by the next SMR command, or until power is no longer supplied to the MPRAM 10. The SMR command may be issued when the DRAM 12 and SRAM 16 are in an idle state. Burst terminate commands BTA and BTB may be issued by the SRAM control circuit 28 to terminate burst sequences from or to the ports A and B, respectively.

Figure 2:
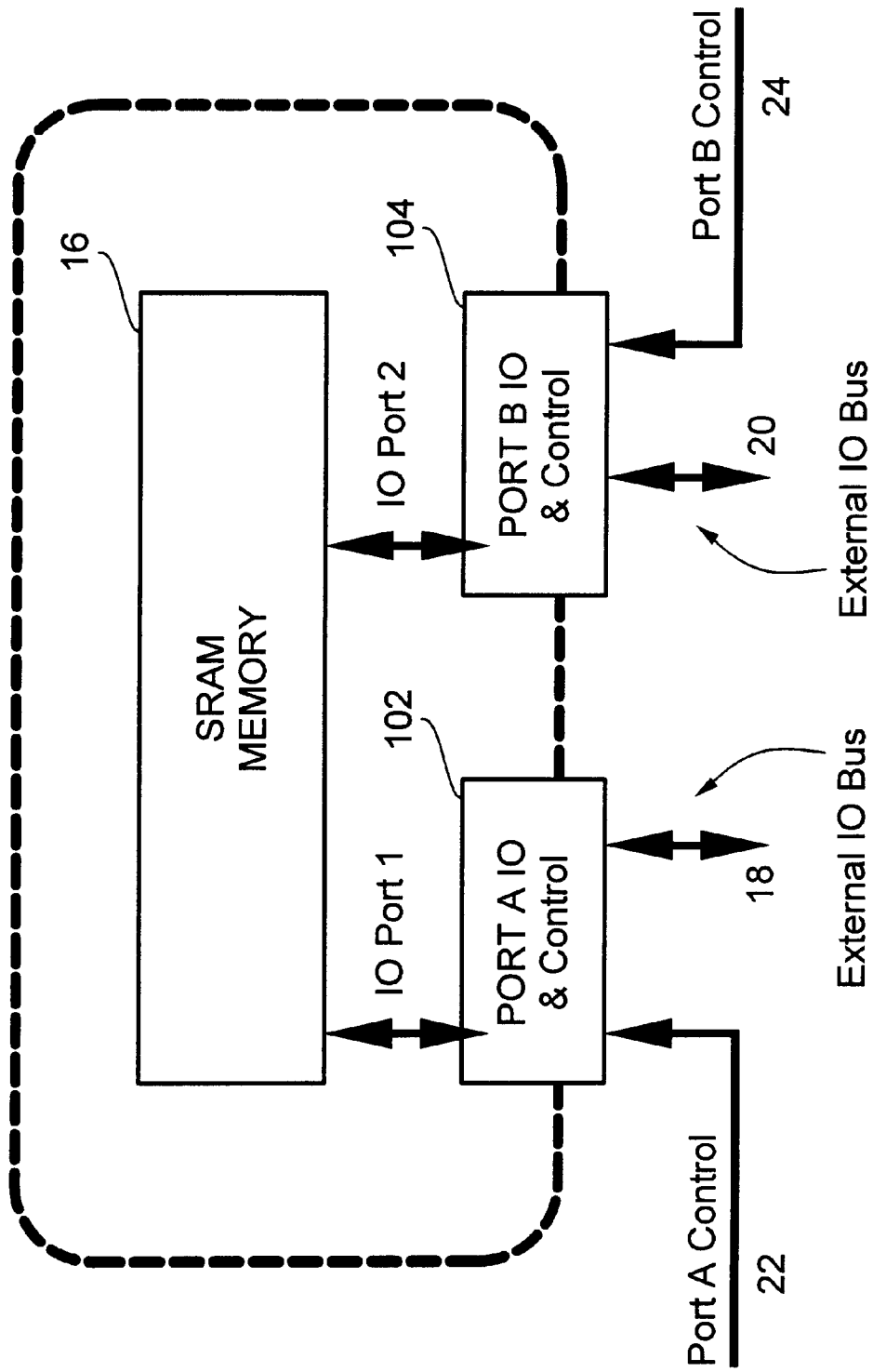
FIG. 2 is a block diagram schematically showing the arrangement of a multi-port RAM with two identical ports.

FIG. 2 schematically shows interconnection between the SRAM 16 and ports A and B. IO and control circuits 102 and 104 for ports A and B, respectively, provide two identical 16-bit data paths for bi-directional data transfer between IO data pins 18 and 20 and corresponding locations of the SRAM 16. The port A control circuit 22 and port B control circuit 24 provide address and control signals to support the data transfer. The structure of the SRAM 16 is disclosed in our copending application Ser. No. 08/936,431, entitled "MULTI-PORT RAM HAVING TRIPLE-PORT SRAM CELLS" filed on Sep. 24, 1997 and incorporated herewith by reference.

As discussed above, each of the ports A and B have address and control pins for receiving external address and control signals. The address and control signals for port A are independent from the address and control signals for port B. Each of the ports can be used as a read-only port, a write-only port, or a read-write port depending on the system requirements. For example, one of the ports can be used for reading data from the SRAM 16, while the other port may provide writing data to the SRAM 16. Read access to the SRAM 16 from one port, and write access to the SRAM 16 from the other port can be performed simultaneously in the same clock cycle.

Figure 3A:
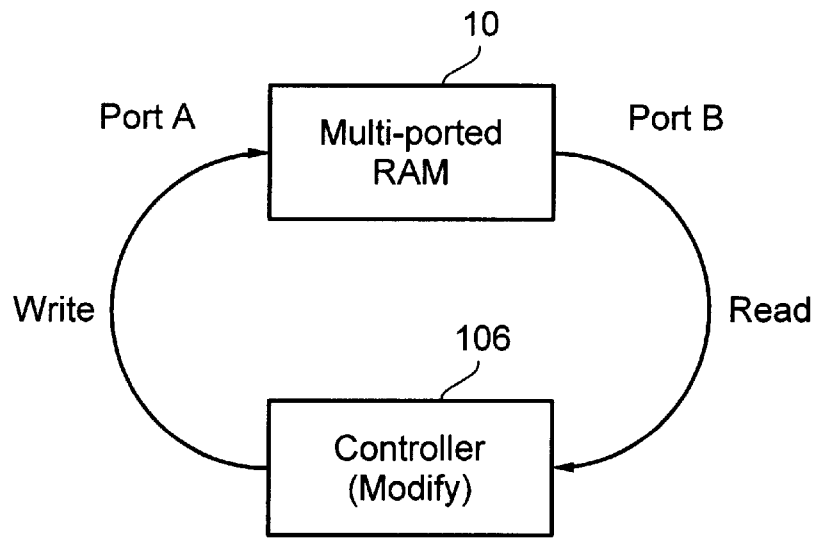
FIGS. 3A–3B illustrate read-modify-write cycles in the multi-port RAM.
Figure 3B:
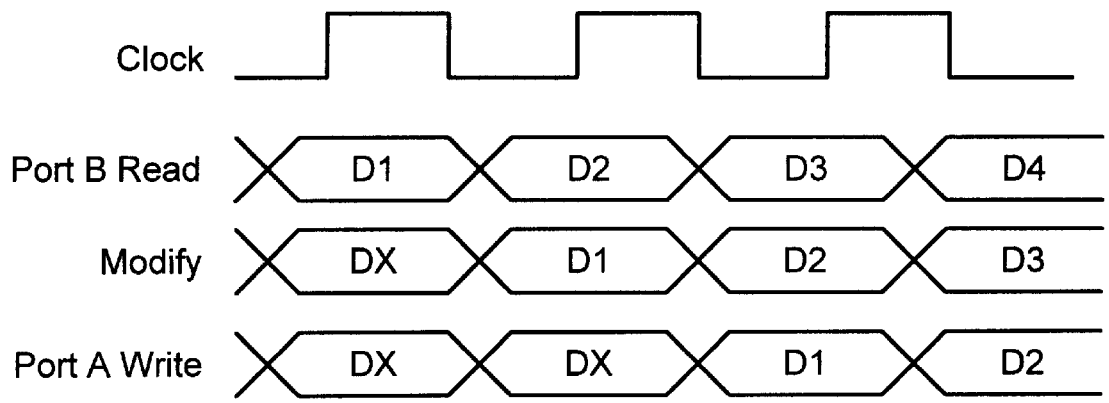

As illustrated in FIGS. 3A and 3B, since ports A and B are functionally independent, an external memory controller 106 coupled to the ports A and B can modify data in the SRAM 16 without having to wait between read and write cycles. By contrast, in a conventional memory, a write cycle is delayed with respect to a read cycle by a time period required to set the IO bus to a high-impedance state.

On every clock cycle, one of the ports A and B can perform a read operation, while the other port can perform a write operation. For example, as shown in FIG. 3B, on a first clock cycle, port B can read a data element D1 from the SRAM 16. It is assumed that the external memory controller 106 requires one clock cycle to modify the data element D1. Thereafter, port A can write the modified data element D1 into the SRAM 16, whereas port B reads another data element. Subsequent data elements D2, D3 and D4 are modified in a similar manner. Thus, the bandwidth of a Read-Modify-Write (RMW) cycle for the SRAM 16 is substantially improved over single-port memories.

Figure 4:
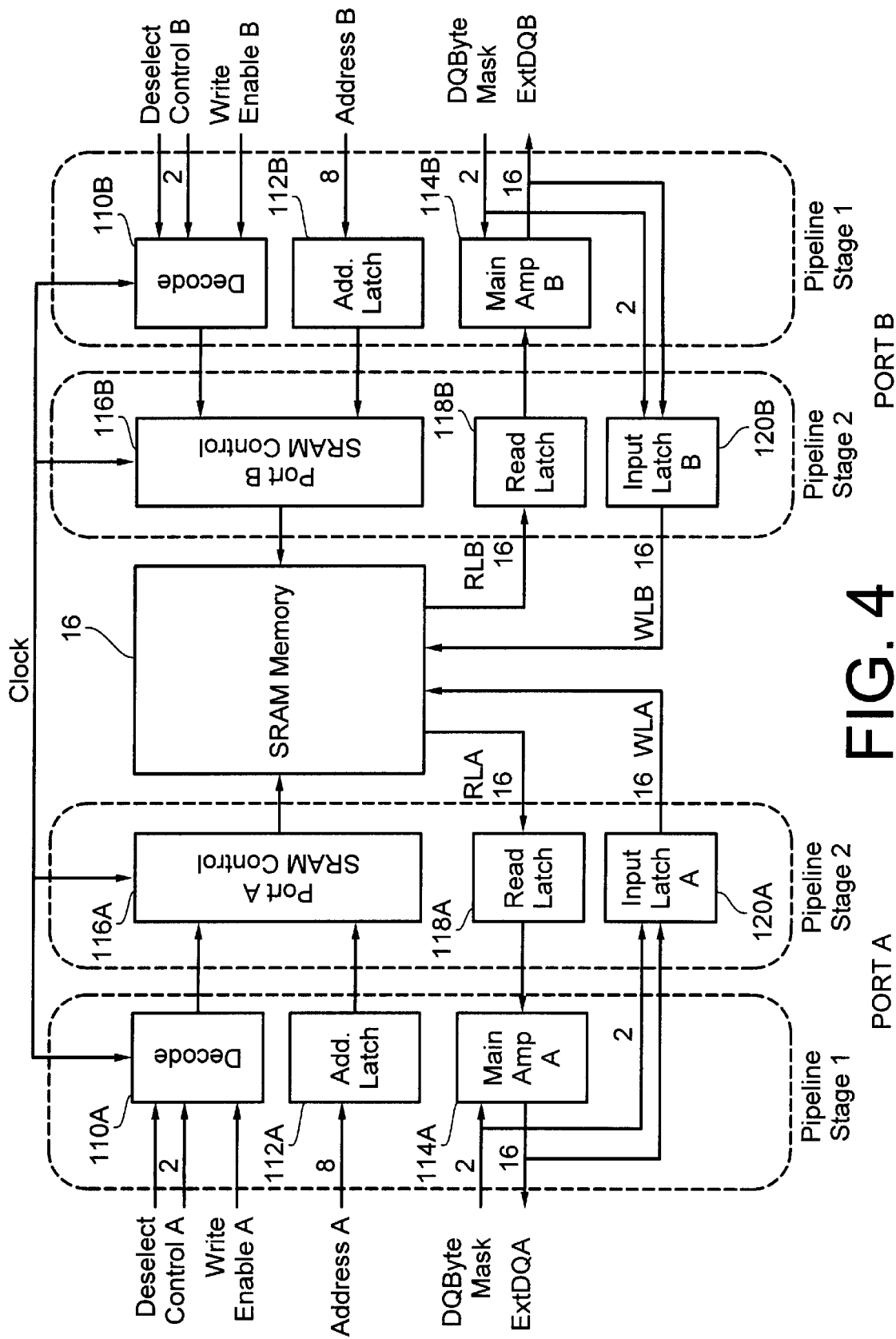
FIG. 4 is a block diagram of data path pipeline stages of the ports in the multi-port RAM.

Referring to FIG. 4, each of the ports A and B comprises a pipelined data path having pipeline stage 1 and pipeline stage 2. The pipeline stages 1 include decoding circuits 110A and 110B, address latches 112A and 112B, and main amplifiers 114A and 114B for ports A and B, respectively. Each of the decoding circuits 110A and 110B independently receives control signals and a write enable signal which are combined and decoded logically to enable read and write operations and masking functions. For example, the SCA, SFA,/WEA signals and the SCB, SFB,/WEB signals may be decoded by the decoding circuits 110A and 110B, respectively.

Also, a deselect signal may be supplied to each of the decoding circuits 110A and 110B to inhibit the ports from accepting commands. For example, the deselect signal may be produced when the chip select signal /SS is set to a predetermined state.

The address latches 112A and 112B are connected to external address lines to receive address signals, such as the 8-bit signals ADA and ADB, for ports A and B, respectively. The main amplifiers 114A and 114B are respectively coupled to the data pins 18 and 20 for supporting the output of the 16-bit data signals DQA and DQB for ports A and B. Also, the main amplifiers 114A and 114B may be connected to the mask control pins 38 and 40 for receiving the two-bit mask control signals DQMA and DQMB for ports A and B, respectively, to perform byte masking of the output data.

The pipeline stages 2 comprise SRAM control circuits 116A and 116B, read latches 118A and 118B, and input latches 120A and 120B for ports A and B, respectively. The SRAM control circuits 116A and 116B are respectively coupled to the decoding circuits 110A and 110B, and address latches 112A and 112B to control read and write accesses to the SRAM memory from ports A and B. The read latches 118A and 118B latch data read from the SRAM memory 16. The input latches 120A and 120B are respectively coupled to the data pins 18 and 20 for writing the 16-bit data DQA and DQB to the SRAM 16. Also, the input latches 120A and 120B are responsive to the mask control signals DQMA and DQMB for performing byte masking of the input data.

Figure 5:
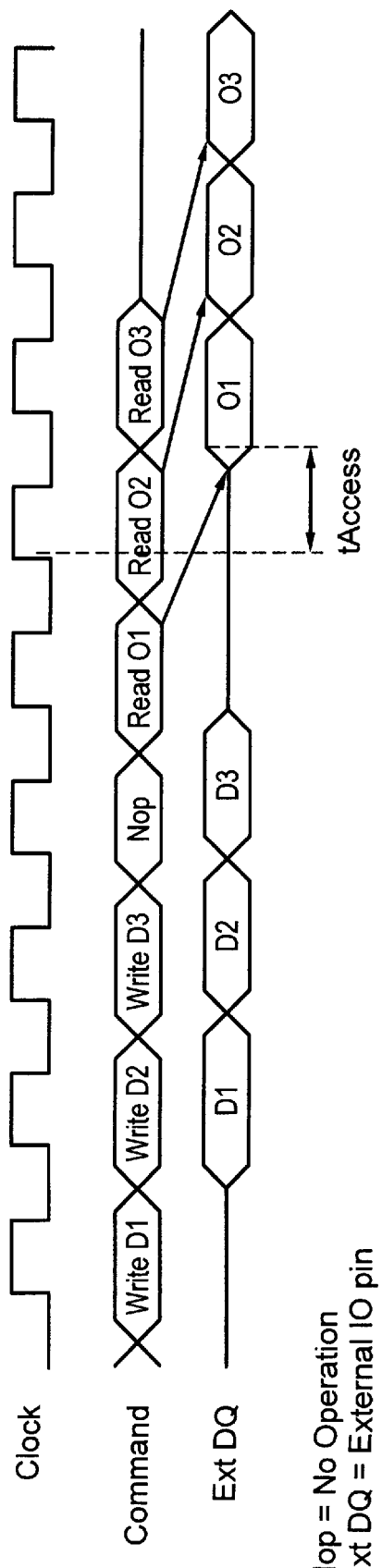
FIG. 5 are timing diagrams illustrating data writing and reading through each of the ports.

Each port in the MPRAM 10 is synchronous and operates from the same system clock supplied to each unit in the pipeline stages 1 and 2 of the both ports. As illustrated in FIG. 5, two clock cycles are required for writing and reading data to and from the SRAM 16.

To write data element D1 from port A, the appropriate write command and address are defined by setting the external control and address signals for port A to required states during a set-up time period before a rising edge of the first clock. On the rising edge of the first clock, the write command Write D1 is decoded by the decoding circuit 110A and the address is latched in the address latch 112A. On the falling edge of the first clock, the SRAM control circuit 116A produces a write address signal to select the requested location in the SRAM 16. On the second clock cycle, the data element D1 is supplied from the external data pins 18 via the input latch 120A to the selected location in the SRAM 16. On the third and forth clock cycles, subsequent data elements D2, D3 provided from the external data pins 18 may be written into the SRAM 16.

The DQB data for port B may be written into the SRAM 16 in a similar manner using the decoding circuit 110B, address latch 112B, the SRAM control circuit 116B and the input latch 120B.

To read data element Q1 (FIG. 5) from the SRAM 16 via port A, the read command and address are defined by setting the external control and address signals for port A to required states during a set-up time period before a rising edge of a clock. On the first clock cycle following a No Operation (NOP) command, the read command Read Q1 is decoded by the decoding circuit 110A and the address is latched in the address latch 112A. Then, the SRAM control circuit 116A produces a read address signal to select a required location in the SRAM 16. On the same clock cycle, the data element Q1 is read from the selected location in the SRAM 16 and latched in the read latch 118A. On the next clock cycle, the main amplifier 114A drives the data element Q1 to the external data pins 18.

The read data is valid by the edge of the third clock. As shown in FIG. 5, the read access time tAccess is measured from the rising edge of the second clock to the instant, in which the read data is valid. The rising edge of the second clock corresponds to the instant, in which the main amplifier 114A begins to drive the read data.

The MPRAM 10 having two functionally identical ports A and B enables a user to combine them into a single 32-bit port. A unified-port mode of operation may be defined by a pre-set control signal supplied via an external pin, by an internal control signal produced using wire-bonding inside the MPRAM 10, or by pre-programming the MPRAM 10.

In the unified-port mode of operation, an external memory controller provides joint control of corresponding external control and address signals supplied to port A and port B control circuits 22 and 24 so as to perform a single 32-bit write or read access to the SRAM 16 via the both ports. In particular, the address signals ADA and ADB are produced so that a 32-bit data combination composed of two 16-bit data words is selected for each access to the SRAM 16. For example, the most significant word of the 32-bit combination may be accessed from port B using the ADB address signal, whereas the least significant word of the data combination may be accessed from port A using the ADA address signal. Thus, the MPRAM enables 16-bit as well as 32-bit read and write accesses to the SRAM 16. Further, if one port of the MPRAM 10 is disabled, the MPRAM 10 would be fully functional via the other port. In particular, any one of ports A and B enables read and write accesses to each and every location in the SRAM 16.

As discussed above, the MPRAM 10 has a programmable burst mode that allows the user to select burst lengths of 1, 2, 4 and 8 words for bursts of data being written from ports A and B to the SRAM 16 or bursts of data being read from the SRAM 16 to ports A and B. Sequential or interleave type of burst may be selected to establish sequential or interleave SRAM addresses of words in each burst.

A set mode register command SMR issued by the DRAM control circuit 42 enables the burst length and type to be programmed in an internal mode register. Ports A and B may be programmed individually so as to allow port A to read or write data burst of one length, whereas port B is enabled to read or write data burst of another length. For example, one port may support reading or writing data bursts having lengths of 4 words, and the other may read or write data bursts having lengths of 2 words. Also, one port may be programmed to support sequential addressing of data bursts, whereas the other port may be programmed to provide interleave addressing.

When the burst mode is set, a data burst is initiated by a read or write command. The address that accompanies the read or write command is considered to be the starting address. Separate internal burst length counters for ports A and B start with the starting address, and automatically generate the subsequent sequential or interleave addresses. No Operation commands are issued for the remainder of the burst length. For example, if the burst length of 8 is programmed for port A, 8 words of data will be automatically read or written via port A in the following 8 cycles.

The SRAM control command SCA, SFA, SCB and SFB, the write enabling commands /WEA and /WEB, and the chip select signal /SS may be set in a predetermined state to produce burst terminate commands BTA and BTB, which terminate burst sequences for ports A and B, respectively. As the control and write enabling commands for port A are independent of the control and write enabling commands for port B, data bursts for port A may be terminated independently of data bursts for port B.

Thus, each port has its own independent burst length counter, burst termination logic and memory addressing logic. Therefore, burst mode operations for port A may be carried out independently of burst mode operations for port B.

There accordingly has been described a memory having a SRAM, a DRAM, and two independent and functionally identical IO ports. Each port may be used as a read-only, a write-only, or a read-write port. One port may perform a read access to the SRAM, whereas the other port may carry out a write access to the SRAM in the same clock cycle. Each and every location of the SRAM may be accessed from any of the ports. Each port comprises a two-stage pipelined data path for providing a read or write access to the SRAM. Stage 1 decodes control and write enable signals, latches address signals and performs the output of read data. Stage 2 supports accesses to SRAM cells for writing and reading data. In a unified-port mode of operation, two 16-bit ports may be combined to produce a single port supporting a 32-bit write or read access to the SRAM. In a data burst mode of operation, each port may be programmed to select individual length of data bursts and individual burst type.

In this disclosure, there are shown and described only the preferred embodiments of the invention, but it is to be understood that the invention is capable of changes and modifications within the scope of the inventive concept as expressed herein.

What is claimed is:

1. A multi-port memory device comprising on a single chip:

first and second input/output pins for providing data input and output, a DRAM main memory for storing data, a SRAM cache memory having smaller storage capacity than said main memory, and arranged on the chip for providing data transfer between said main memory and said first and second input/output pins arranged on the same chip, a first data path coupled between said first input/output pin and said cache memory for providing bi-directional data transfers between said cache memory and said first input/output pin, and a second data path coupled between said second input/output pin and said cache memory for providing bi-directional data transfers between said cache memory and said second input/output pin, said first data path being interchangeable with said second data path in providing access to said cache memory, wherein each of said first and second data paths comprises a pipeline having a first stage and a second stage for providing read and write access to said cache memory.

2. The memory device of claim 1, wherein said first stage comprises a decoding circuit for decoding write control signals.

3. The memory device of claim 2, wherein said second stage coupled between said first stage and said cache memory comprises a control circuit responsive to address signals and the decoded write control signals for supplying said cache memory with a write address signal for selecting a location in said cache memory.

4. The memory device of claim 3, wherein said second stage comprises an input latch for receiving data from said first or second input/output pin and writing said data into the selected location in said cache memory.

5. The memory device of claim 1, wherein said first stage comprises a decoding circuit for decoding read control signals.

6. The memory device of claim 5, wherein said first stage further comprises an amplifier coupled to said first or second input/output pin for driving data read from said cache memory.

7. The memory device of claim 6, wherein said second stage coupled between said first stage and said cache memory comprises a control circuit responsive to address signals and the decoded read control signals for supplying said cache memory with a read address signal for selecting a location in said cache memory.

8. The memory device of claim 7, wherein said second stage further comprises a read latch for receiving the data read from the selected location in said cache memory.

9. A multi-port memory device comprising on a single chip:

first and second input/output pins for providing data input and output, a DRAM main memory for storing data, a SRAM cache memory having smaller storage capacity than said main memory, and arranged on the chip for providing data transfer between said main memory and said first and second input/output pins arranged on the same chip, a first data path coupled between said first input/output pin and said cache memory for providing bi-directional data transfers between said cache memory and said first input/output pin, and a second data path coupled between said second input/output pin and said cache memory for providing bi-directional data transfers between said cache memory and said second input/output pin, said first data path being interchangeable with said second data path in providing access to said cache memory, wherein said first and second data paths are arranged so as to provide a single port for input/output of a data combination to or from said cache memory.

10. The memory device of claim 9, wherein said first data path is arranged to provide input/output of the least significant word in said data combination.

11. The memory device of claim 10, wherein said second data path is arranged to provide input/output of the most significant word in said data combination.

12. In a memory device having first and second input/output ports, a SRAM cache memory, a DRAM main memory, a method of data transfer comprising the steps of:

controlling said first input/output port for providing input/output of the least significant word of a data combination to or from said cache memory, and simultaneously controlling said second input/output port for providing input/output of the most significant word of a data combination to or from said cache memory.

* * * * *